US011221774B2

(12) United States Patent
Shin et al.

(10) Patent No.: US 11,221,774 B2
(45) Date of Patent: *Jan. 11, 2022

(54) POWER DOWN MODE FOR UNIVERSAL FLASH STORAGE (UFS)

(71) Applicant: QUALCOMM Incorporated, San Diego, CA (US)

(72) Inventors: Hyunsuk Shin, Los Angeles, CA (US); Todd Christopher Reynolds, Santee, CA (US); Hung Vuong, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/011,720

(22) Filed: Sep. 3, 2020

(65) Prior Publication Data
US 2020/0401333 A1 Dec. 24, 2020

Related U.S. Application Data

(63) Continuation of application No. 16/030,841, filed on Jul. 9, 2018, now Pat. No. 10,802,736.
(Continued)

(51) Int. Cl.
*G06F 3/06* (2006.01)
*G11C 5/14* (2006.01)
(Continued)

(52) U.S. Cl.
CPC .......... *G06F 3/0634* (2013.01); *G06F 1/3275* (2013.01); *G06F 3/0625* (2013.01);
(Continued)

(58) Field of Classification Search
CPC .... G06F 1/3275; G06F 3/0634; G06F 3/0625; G06F 3/0679; G06F 13/1668;
(Continued)

(56) References Cited

U.S. PATENT DOCUMENTS 5,822,246 A 10/1998 Taub et al.
7,881,142 B2 2/2011 Arakawa et al.
(Continued)

OTHER PUBLICATIONS

International Search Report and Written Opinion—PCT/US2018/041628—ISA/EPO—dated Oct. 9, 2018.

*Primary Examiner* — Vanthu T Nguyen
(74) *Attorney, Agent, or Firm* — Qualcomm Incorporated

(57) ABSTRACT

Systems and method are directed to Universal Flash Storage (UFS) memory system configured to support deep power-down modes wherein the UFS memory system is not required to be responsive to commands received from a host device coupled to the UFS memory system. Correspondingly, in the deep power-down modes, a link or interface between the UFS memory system and the host device may also be powered down. The UFS memory system may enter the deep power-down modes based on a command received from the host device or a hardware reset assertion, and exit the deep power-down modes based on a hardware reset de-assertion or power cycling. While in deep power-down modes, the power consumption of the UFS memory device is substantially lower than the power consumption of the UFS memory device in conventional power modes.

14 Claims, 9 Drawing Sheets

| Mode | Enter condition | Exit condition | Power supply | Link status | UFS Device status | Response to host commands | Power consumption |
|---|---|---|---|---|---|---|---|
| UFS-Sleep | Device receives START STOP UNIT command with POWER CONDITION = 2H | Device receives START STOP UNIT command with POWER CONDITION = 1H | VCC (NAND memory core power) can be turned OFF. VCCQ/VCCQ2 Controller power) should be ON. | Hibernate or STALL | Device is in low power mode | Device responds to certain commands (START STOP UNIT and REQUEST SENSE), but returns error to all the other commands | Hundreds of uA |
| UFS Power Down | Device receives START STOP UNIT command with POWER CONDITION = 3H | Device receives START STOP UNIT command with POWER CONDITION = 1H | VCC (NAND memory core power) can be turned OFF. VCCQ/VCCQ2 Controller power) should be ON. | Hibernate or STALL | Device is in low power mode | Device responds to certain commands (START STOP UNIT and REQUEST SENSE), but returns error to all the other commands | Hundreds of uA (same as UFS-Sleep mode) |
| UFS-Deep Power Down – option #1 | Device receives START STOP UNIT command with POWER CONDITION = 4H | Hardware reset deassertion (transition from low to high) or power cycling | VCC (NAND memory core power) can be turned OFF. VCCQ/VCCQ2 Controller power) should be ON. | UN-POWERED | Device is in minimum power mode (waken up only by reset) | Does not respond to host except hardware reset | <<UFS-Sleep <<UFS-PowerDown |
| UFS-Deep Power Down – option #2 | Hardware reset assertion (transition from high to low) | Hardware reset deassertion (transition from low to high) or power cycling | VCC (NAND memory core power) can be turned OFF. VCCQ/VCCQ2 Controller power) should be ON. | UN-POWERED | Device is in minimum power mode (waken up only by reset) | Does not respond to host except hardware reset | <<UFS-Sleep <<UFS-PowerDown |

Related U.S. Application Data

(60) Provisional application No. 62/537,885, filed on Jul. 27, 2017.

(51) Int. Cl.
   *G06F 1/3234* (2019.01)
   *G11C 16/30* (2006.01)
   *G06F 13/16* (2006.01)

(52) U.S. Cl.
   CPC ........ *G06F 3/0679* (2013.01); *G06F 13/1668* (2013.01); *G11C 5/147* (2013.01); *G11C 5/148* (2013.01); *G11C 16/30* (2013.01); *G11C 2207/2227* (2013.01)

(58) Field of Classification Search
   CPC ......... G11C 5/147; G11C 5/148; G11C 16/30; G11C 2207/2227
   See application file for complete search history.

(56) References Cited

U.S. PATENT DOCUMENTS

| | | |
|---|---|---|
| 8,843,696 B2 | 9/2014 | Hasegawa |
| 9,037,890 B2 | 5/2015 | De Caro et al. |
| 9,336,882 B2 | 5/2016 | Katayama et al. |
| 9,483,108 B2 | 11/2016 | De Caro et al. |
| 9,922,684 B2 | 3/2018 | Pedersen et al. |
| 10,042,587 B1 | 8/2018 | Pedersen |
| 10,235,312 B2 | 3/2019 | Cho et al. |
| 10,539,989 B1 | 1/2020 | Pedersen et al. |
| 2003/0163617 A1 | 8/2003 | Shigenobu et al. |
| 2015/0205339 A1 | 7/2015 | Park et al. |
| 2019/0034106 A1 | 1/2019 | Shin et al. |

| Mode | Enter condition | Exit condition | Power supply | Link status | UFS Device status | Response to host commands | Power consumption |
|---|---|---|---|---|---|---|---|
| Active | Device starts any operation | Device completes all the operation | All power should be ON | STALL or HS-BURST | Device is performing operation | Respond to any commands | >> Idle mode |
| Idle | Device completes all the operation | Device needs to start any operation | All power should be ON | HIBERNATE or STALL | Device is ready for the operation | Respond to any commands | >> UFS-Sleep mode |
| UFS Sleep | Device receives START STOP UNIT command with POWER CONDITION = 2h | Device receives START STOP UNIT command with POWER CONDITION = 1h | VCC (NAND memory core power) can be turned OFF. VCCQ/ VCCQ2 (Controller power) should be ON. | HIBERNATE or STALL | Device is in low power mode | Device responds to certain commands (START STOP UNIT and REQUEST SENSE), but returns error to all the other commands | Hundreds of uA |
| UFS-Power Down | Device receives START STOP UNIT command with POWER CONDITION = 3h | Device receives START STOP UNIT command with POWER CONDITION = 1h | VCC (NAND memory core power) can be turned OFF. VCCQ/ VCCQ2 (Controller power) can be turned OFF. | HIBERNATE or STALL | Device is in low power mode | Device responds to certain commands (START STOP UNIT and REQUEST SENSE), but returns error to all the other commands | Hundreds of uA (same as UFSSleep mode) |

*FIG. 2A*

POWER DOWN MODE FOR UNIVERSAL FLASH STORAGE (UFS)

CLAIM OF PRIORITY UNDER 35 U.S.C. § 119

The present application for patent is a U.S. Continuation Application of U.S. patent application Ser. No. 16/030,841, filed Jul. 9, 2018, which claims the benefit of U.S. Provisional Patent Application No. 62/537,885, entitled "POWER DOWN MODE FOR UNIVERSAL FLASH STORAGE (UFS)," filed Jul. 27, 2017, assigned to the assignee hereof, and expressly incorporated herein by reference in its entirety.

FIELD OF DISCLOSURE

Disclosed aspects are directed to Flash memory systems. More particularly, exemplary aspects are directed to power modes for Universal Flash Storage (UFS).

BACKGROUND

Universal Flash Storage (UFS) is a Flash memory system defined by the Joint Electron Device Engineering Council (JEDEC) standard, designed for high data transfer speed and low power consumption. Correspondingly, UFS is well-suited for mobile applications (e.g., mobile phones, laptop computers, handheld devices, tablets, etc.) where high performance demands are seen in conjunction with low power consumption requirements. A UFS memory system may be an embedded device within a host such as a processor or system on chip (SoC), or may be integrated on a removable card, for flexible use with different hosts. Different standards and configurations may be applicable to the available UFS memory systems.

For example, UFS memory systems as well as their interfaces to the hosts may include multiple layers to support the standards. The host may include a Host Controller Interface (HCI) and a UFS Transport Protocol (UTP) as defined in the JEDEC standard, as well as a Unified Protocol (Unipro) and a physical interface referred to as M-PHY as defined by the Mobile Industry Processor Interface (MIPI) alliance.

The UFS memory system host may include a memory core made of technology such as NAND Flash memory cells (alternatively, other types of Flash memory cells such as NOR Flash memory cells may also be used in some implementations). The UFS memory system may include an input/output (I/O) interface to send/receive data and also to receive commands and other control signals sent from the host device. Further, the UFS memory system may include a UFS controller which may be in communication with the I/O and may have counterpart components of the host device such as UTP, Unipro, M-PHY, etc. Additionally a processor or central processing unit (CPU) may also be included within or in communication with the UFS controller.

An interface or bus may be provided for the host to communicate with the UFS memory system. The interface may be configured to transport the data, commands, etc. noted above and additionally, may include one or more signals to control power rail connections to the components of the UFS memory system. These power rails may be controlled to place various components of the UFS memory system in different power states, based, for example, on different power modes that may be specified for the UFS memory systems.

However, it is recognized that conventional power modes, defined, for example, in the JEDEC standard for UFS memory systems do not efficiently contribute to improvement in power consumption of the UFS memory systems. One reason for this is that even though the conventional low power modes for the UFS memory systems specify that the power rails remain active, to place one or more components of the UFS memory system in a powered state, for example, to remain responsive to at least a subset of commands received from the host device (even though the UFS memory system may be configured to ignore or provide error messages in response to many or most of the commands that may be received from the host device during the low power modes). Correspondingly, the conventional designs for UFS memory systems tend to consume significant power even in the low power modes.

As will be appreciated, there is an ever increasing and well-recognized need for reducing power consumption in processing systems, particularly for battery powered or mobile/handheld systems. There is accordingly, a corresponding need to further reduce power consumption of the UFS memory systems beyond the power consumption savings which are currently achievable using conventional power modes.

SUMMARY

Exemplary aspects of the invention include systems and methods directed to a Universal Flash Storage (UFS) memory system configured to support exemplary power savings modes. The exemplary power savings modes include, for example, two deep power-down modes wherein the UFS memory system is not required to be responsive to commands received from a host device coupled to the UFS memory system. Correspondingly, in the deep power-down modes, a link or interface between the UFS memory system and the host device may also be powered down. Once the UFS memory system is placed in one of the two deep power-down modes, e.g., based on a command received from the host device or a hardware reset assertion, the UFS memory system may transition out of the deep power-down mode based on a hardware reset de-assertion or power cycling, e.g., to a power mode wherein the UFS memory system may once again be responsive to commands from the host device. While in either of the two deep power-down modes, the power consumption of the UFS memory device is substantially lower than the power consumption of the UFS memory device in conventional power modes.

For example, one exemplary aspect is directed to an apparatus comprising a Universal Flash Storage (UFS) memory device communicatively coupled to a host device, wherein the UFS memory device configured to support one or more power modes, wherein the one or more power modes comprise at least one low power mode wherein the UFS memory device is not responsive to any commands received from the host device.

Another exemplary aspect is directed to a method of power management of a Universal Flash Storage (UFS) memory device communicatively coupled to a host device, the method comprising placing the UFS memory device in at least one low power mode wherein the UFS memory device is not responsive to any commands received from the host device.

Another exemplary apparatus is directed to an apparatus comprising a host device configured to provide a command and a hardware reset signal to a Universal Flash Storage (UFS) memory device, wherein the UFS memory device enters or exits one or more power modes in response to the received command or the hardware reset signal, and wherein the UFS memory device in the one or more power modes is not responsive to the command received from the host device.

Yet another exemplary aspect is directed to an apparatus comprising a Universal Flash Storage (UFS) memory device communicatively coupled to a host device, and means for placing the UFS memory device in at least one low power mode wherein the UFS memory device is not responsive to any commands received from the host device.

BRIEF DESCRIPTION OF THE DRAWINGS

The accompanying drawings are presented to aid in the description of aspects of the invention and are provided solely for illustration of the aspects and not limitation thereof.

FIGS. 2A-C illustrate a table of conventional power modes for a Flash memory device and circuit configurations thereof.

DETAILED DESCRIPTION

Figure 1:
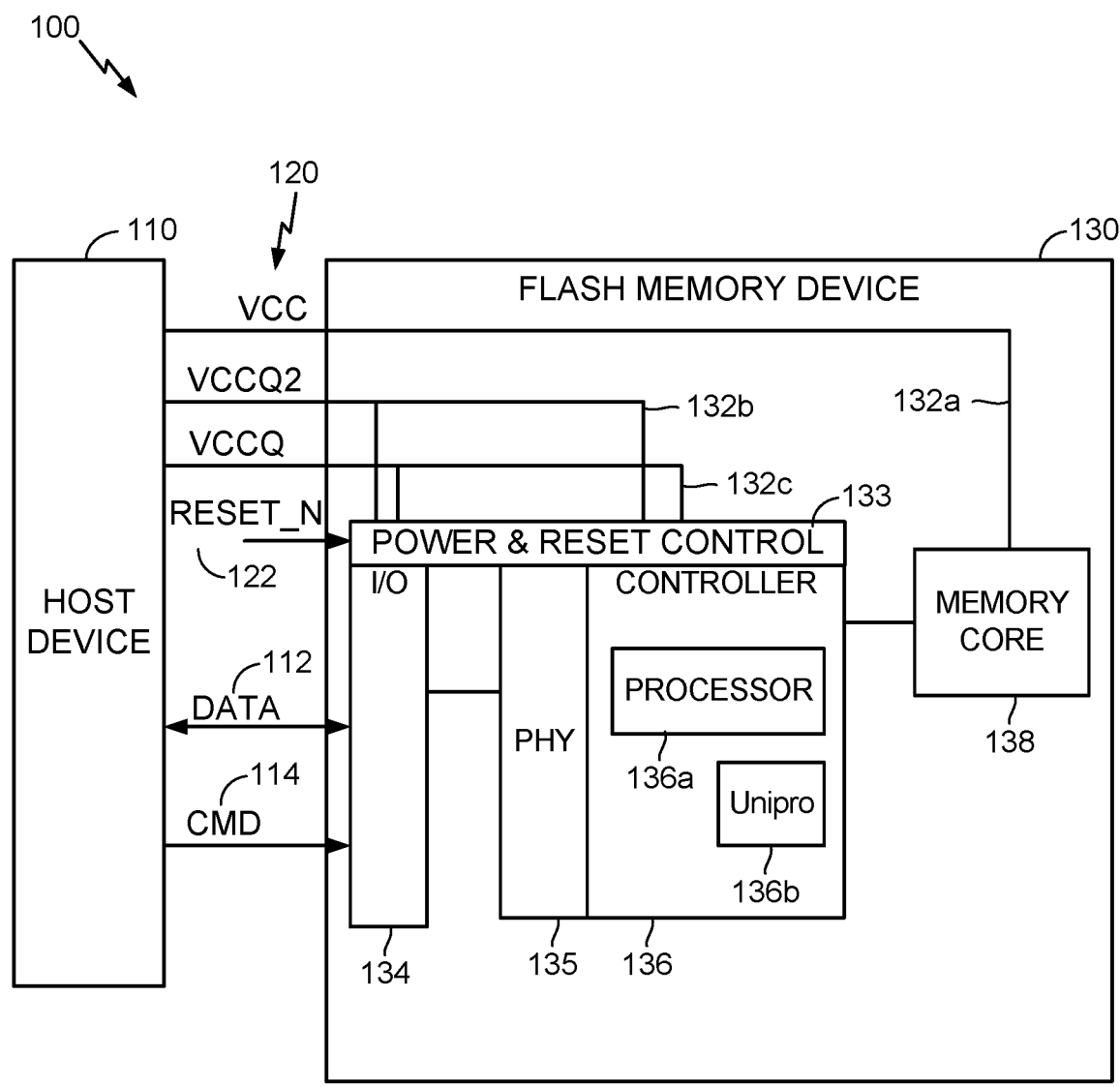
FIG. 1 illustrates a processing system with a host device coupled to a Flash memory device through an interface.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to a Universal Flash Storage (UFS) memory system configured to support exemplary power savings modes. The exemplary power savings mode include, for example, two deep power-down modes wherein the UFS memory system is not required to be responsive to commands received from a host device coupled to the UFS memory system.

Correspondingly, in the deep power-down modes, a link or interface between the UFS memory system and the host device may also be powered down. Once the UFS memory system is placed in one of the deep power-down modes, e.g., based on a command received from the host device or a hardware reset assertion, the UFS memory system may transition out of the deep power-down mode based on a hardware reset de-assertion or power cycling to a power mode wherein the UFS memory system may once again be responsive to commands from the host device. While in either of the two deep power-down modes, the power consumption of the UFS memory device is substantially lower than the power consumption of the UFS memory device in conventional power modes.

With reference now to FIG. 1, an exemplary processing system 100 is shown, comprising host device 110 and Flash memory device (e.g., UFS memory system) 130, with an interface generally designated with the reference numeral 120 shown between host device 110 and Flash memory device 130.

Host device 110 may be any processor, core, SoC, etc., which may be designed according to the JEDEC and MIPI standards to support and access Flash memory stored in Flash memory device 130. Host device 110 may include various components which have not been specifically illustrated, but may include, for example, a Unipro, M-PHY, a Reference M-PHY Module Interface (RMMI) interface coupled between the Unipro and M-PHY, etc. Host device 110 may also include a Host Controller Interface (HCI) to support sending/receiving commands (e.g., CMD 114), data (e.g., data 112), etc., e.g., on interface 120 designed according to the JEDEC standard.

Example components are shown for Flash memory device 130 for the sake of elucidation of exemplary aspects, while it will be understood that alternative implementations of Flash memory device 130 are possible without departing from the scope of this disclosure.

Accordingly, as shown, Flash memory device 130 includes an input/output (I/O) block 134, configured to send/receive data, e.g., to/from host device 110, as well as various commands (e.g., associated with read/write functions of the data; CMD 114).

Flash memory device 130 is also shown to comprise memory core 138, which may include one or more banks, arrays, and/or other organization of the memory cells, e.g., designed using Flash memory technology such as NAND Flash memory cells.

Flash memory device 130 is also shown to include a physical interface (PHY) 135 in communication with controller 136. Controller 136 may be a Flash memory controller or UFS controller, generally configured to control access to memory core 138 based, for example, on information from I/O block 134. In an example implementation, controller 136 may comprise various components such as a central processing unit (CPU) designated as processor 136a, Unipro 136b, etc.

Power control signals VCC, VCCQ2, VCCQ are shown as part of interface 120, received at Flash memory device 130 from host device 110, which are configured to control corresponding power rails VCC 132a, VCCQ2 132b, VCCQ 132c in Flash memory device 130. Power rail VCC 132a, which may be at a nominal voltage of 3.3V, for example, may be configured to supply power to memory core 138. Power rails VCCQ 132b and VCCQ2 132c may be derived from power rail VCC 132a (e.g., using voltage regulators, not specifically illustrated), which may be at respective nominal voltages of 1.8V and 1.2V, for example, and configured to supply power to I/O block 134, PHY 135, controller 136, etc. The above-mentioned power control signals may be configured to control the respective power rails based on various power modes which may be specified for Flash memory device 130. In exemplary aspects, power and reset control block 133 may be configured to receive an exemplary control signal from host device 110 and/or a hardware reset signal (shown as RESET N 122, which may be an active-low signal) and turn off the power supply from power rails VCCQ 132b and VCCQ2 132c to the components such as to I/O block 134, PHY 135, controller 136, etc. The control signal and/or hardware reset with reference to exemplary power modes, such as UFS deep power-down modes 1 and 2, will be discussed in further detail in the following sections.

With reference now to FIG. 2A (in conjunction with FIG. 1), some of the power modes which may be available, e.g., according to existing JEDEC standards for UFS memory systems is shown in table 200. Specifically, active mode, idle mode, UFS sleep mode, and UFS power down mode are shown in rows of column 200a, with the characteristics of each of these modes shown in the various columns 200b-h. In more detail, column 200b shows the enter conditions for entering the respective power modes; column 200c shows the related exit conditions; column 200d shows the power supply provided in the respective modes; column 200e shows the link status, e.g., pertaining to data 112 and CMD 114 of interface 120, in the respective modes; column 200f shows the UFS device status, e.g., of Flash memory device 130 in the respective modes; column 200g shows the responsiveness, e.g., of Flash memory device 130 to commands from host device 110 in the respective modes; and column 200h illustrates example values for power consumption in the respective modes.

Figure 2B:
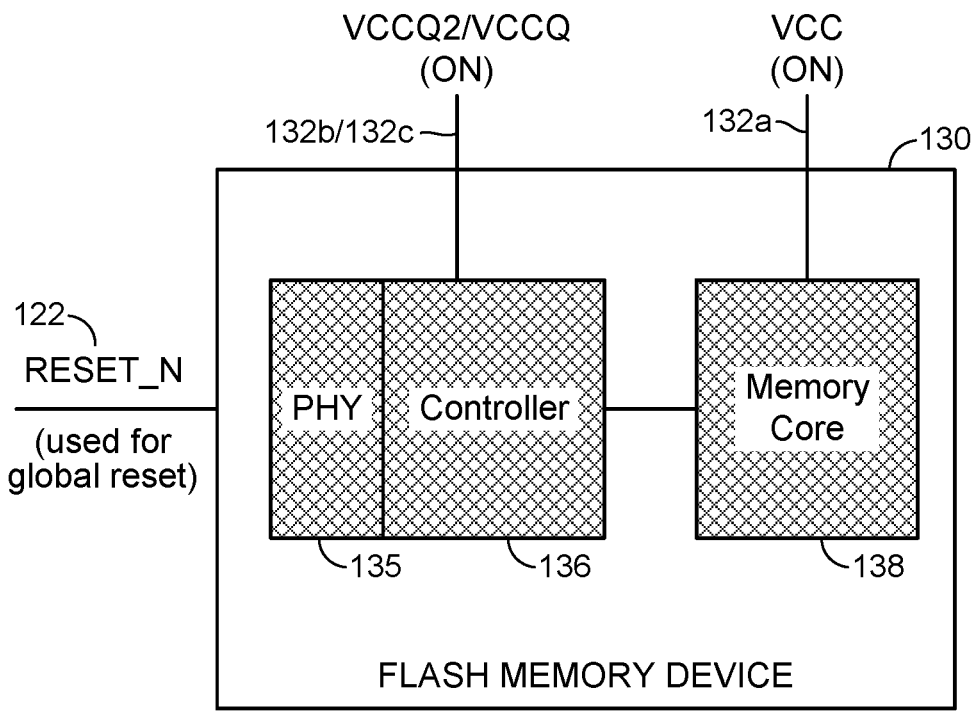

Considering the active mode first, with combined reference to FIGS. 2A-B, it is seen that this mode may be entered (column 200b) when any operation is started on Flash memory device 130 and exited (column 200c) when the operation is complete. Power control signals VCC, VCCQ2, VCCQ are configured to activate or turn on all of the power rails VCC 132a, VCCQ2 132b, VCCQ 132c shown in FIG. 1 in the active mode (column 200d), illustrated with the shading corresponding to legend "power on" for the respective blocks PHY 135, controller 136, and memory core 138 (I/O block 134 is not separately shown in this view but may be similarly turned on as the remaining blocks). The link status (column 200e) pertaining to data 112 and CMD 114 of interface 120 in the active mode involves support for stalling or burst operations; and the state of Flash memory device 130 (column 200f) is that of the operation (e.g., entered in column 200b) being performed. In the active mode, Flash memory device 130 is expected to be responsive to any command (column 200g) which may be received from host device 110, and so correspondingly, the power consumption (column 200h) is fairly high (shown as being significantly greater than the power consumption in the idle mode, and with higher values of ICC, ICCQ2 in FIG. 2C, which will now be discussed in greater detail below).

Referring now to the idle mode, once again, with combined reference to FIGS. 2A-B, this mode may be entered (column 200b) when Flash memory device 130 completes execution of all pending operations and the idle mode is exited (column 200c) when a new operation is to be started by Flash memory device 130. Power control signals VCC, VCCQ2, VCCQ are configured to turn on or activate all of the power rails VCC 132a, VCCQ2 132b, VCCQ 132c shown in FIG. 1 in the idle mode (column 200d) as well, similar to the active mode. The link status (column 200e) of interface 120 in the idle mode involves support for stalling or hibernating; and the state of Flash memory device 130 (column 200f) is that of being ready to perform any operation (e.g., upon exiting the idle mode in column 200c). In the idle mode, Flash memory device 130 is expected to be responsive to any command (column 200g) which may be received from host device 110, and so correspondingly, the power consumption (column 200h), while relatively low in comparison to the active mode (since no operation is performed in the idle mode), the power consumption is also relatively high in comparison to the UFS sleep mode, which will now be discussed in greater detail below.

Figure 2C:
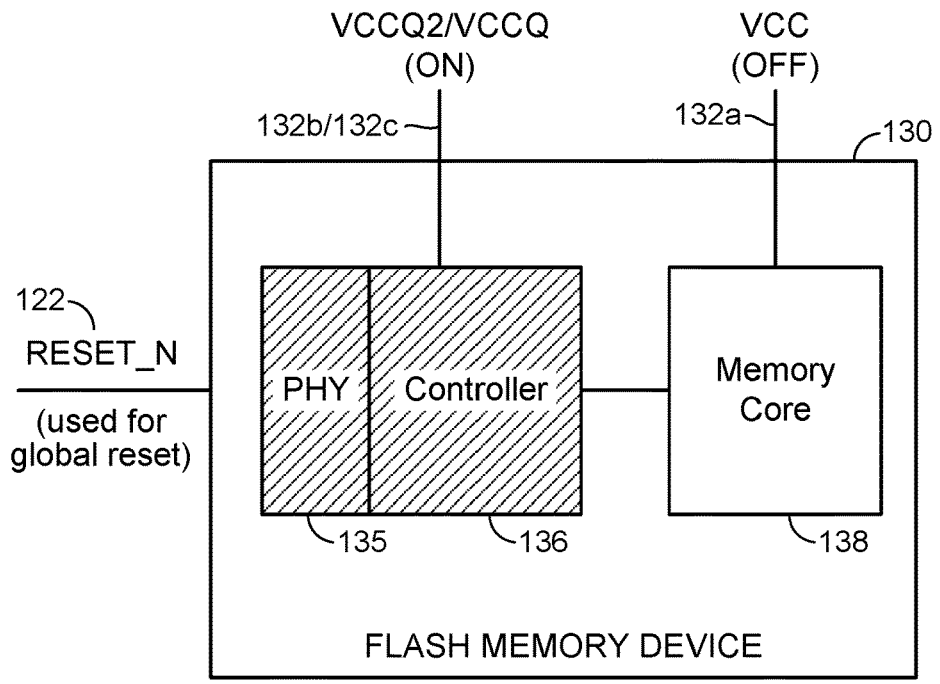
Figure 2C:
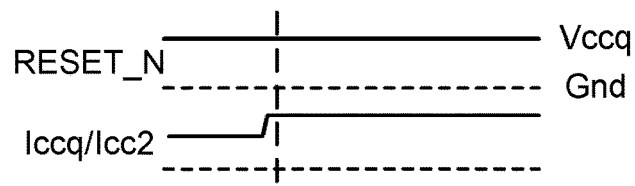
Figure 2C:
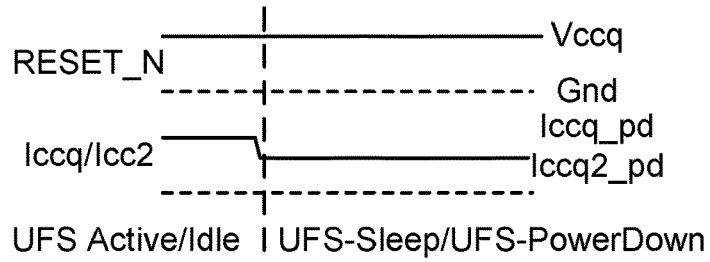

With combined reference now to FIG. 2A, C, the UFS sleep mode may be entered (column 200b) when Flash memory device 130 receives a specific command from host device 110, wherein the specific command, in one standard implementation is shown as the START STOP UNIT command with POWER CONDITION set to a value of "2 h". The UFS sleep mode is exited (column 200c) when the START STOP UNIT command with POWER CONDITION set to a value of "1 h" is received from host device 110. In the UFS sleep mode, memory core 138 may be powered down, and so, correspondingly, power control signal VCC is provided to turn off power rail VCC 132a. However, some of the remaining components such as I/O block 134, controller 136, etc., are required to remain powered on while in the UFS sleep mode, in order to be responsive to the exit commands. Correspondingly, power control signals VCCQ2, VCCQ are provided to activate the power rails VCCQ2 132b and VCCQ 132c as shown in FIG. 2C to supply partial power (shown with shading according to the legend for partial power) to the above-mentioned components such as PHY 135 and controller 136. The link status (column 200e) pertaining to data 112 and CMD 114 of interface 120 in the UFS sleep mode involves support for stalling or hibernating; and the state of Flash memory device 130 (column 200f) is in a low power mode, with memory core 138 being powered down as mentioned above. As previously noted, in the UFS sleep mode, Flash memory device 130 is expected to be responsive to at least a subset of commands (column 200g) which may be received from host device 110, e.g., the exit command with POWER CONDITION set to a value of "1 h", a REQUEST SENSE command received from host device 110, etc.; while Flash memory device 130 may return an error message to other commands not belonging to the subset of commands to which Flash memory device 130 is expected to remain responsive while in the UFS sleep mode. Correspondingly, the power consumption (column 200*h*), is also low, corresponding to ICCQ/ICCQ2 in the order of hundreds of uA, since at least memory core 138 (which consumes significant power to remain active) is powered down in the UFS sleep mode.

The UFS power down mode is yet another low power mode, also shown and described with reference to FIG. 2A, C. The UFS power down mode may be defined in conventional specifications, but as will be understood from the below description, the UFS power down mode may effectively accomplish the same power savings as the UFS sleep mode, even though it has been separately defined with at least some characteristics in columns 200*b-h* which are different from the respective characteristics of the UFS sleep mode discussed above.

In further detail, the UFS power down mode may be entered (column 200*b*) when Flash memory device 130 receives a specific command from host device 110, wherein the specific command, in one standard implementation is shown as the START STOP UNIT command with POWER CONDITION set to a value of "3 h". The UFS power down mode is exited (column 200*c*) when the START STOP UNIT command with POWER CONDITION set to a value of "1 h" is received from host device 110 (similar to the UFS sleep mode). In the UFS power down mode, memory core 138 may be powered down, and so, correspondingly, power control signal VCC is provided to turn off power rail VCC 132*a*. However, while some of the remaining components such as PHY 135, controller 136, etc., are not specified as being required to remain powered on while in the UFS power down mode, in practical implementations, these components are nevertheless required to remain powered on and cannot be turned off while in this mode because once again, in the UFS power down mode, Flash memory device 130 is expected to be responsive to some commands such as the above mentioned exit command (column 200*c*) received from host device 110. Correspondingly, power control signals VCCQ2, VCCQ are provided to activate the power rails VCCQ2 132*b* and VCCQ 132*c* shown in FIG. 1 to supply partial power to the above-mentioned components such as PHY 135 and controller 136 even in the UFS power down mode, even though the specification does not strictly require this (column 200*d*). The link status (column 200*e*) pertaining to data 112 and CMD 114 of interface 120 in the UFS power down mode may also involve support for stalling or hibernating, similar to the UFS sleep mode; and the state of Flash memory device 130 (column 200*f*) is in a low power mode, with memory core 138 being powered down as mentioned above. As previously noted, in the UFS power down mode as well, Flash memory device 130 is expected to be responsive to at least a subset of commands (column 200*g*) which may be received from host device 110, e.g., the exit command with POWER CONDITION set to a value of "1 h", a REQUEST SENSE command received from host device 110, etc.; while Flash memory device 130 may return an error message to other commands not belonging to the subset of commands to which Flash memory device 130 is expected to remain responsive while in the UFS power down mode. Correspondingly, the power consumption (column 200*h*), is also low, with corresponding ICCQ/ICCQ2 in the order of hundreds of uA, but effectively the same as or comparable to the power consumption in the UFS sleep mode, since some components such as PHY 135, controller 136, etc., are to remain powered on, at least partially, similar to the UFS sleep mode.

It is also noted that conventional implementations of Flash memory devices 130 may not support an option to turn off the power rails VCCQ2 132*b* and VCCQ 132*c* (column 200*d*) in the UFS power down mode because this may require a dedicated voltage regulator for effecting on/off states of these power rails, and such dedicated voltage regulators may add additional costs. Furthermore, controlling such voltage regulators may also contribute to penalties for exiting and entering the UFS power down mode in columns 200*b-c*, for example, which may lead to conventional implementations choosing to forego support for the option to turn off the power rails VCCQ2 132*b* and VCCQ 132*c* even though the standards may specify that there is an option to do so.

Figure 3A:
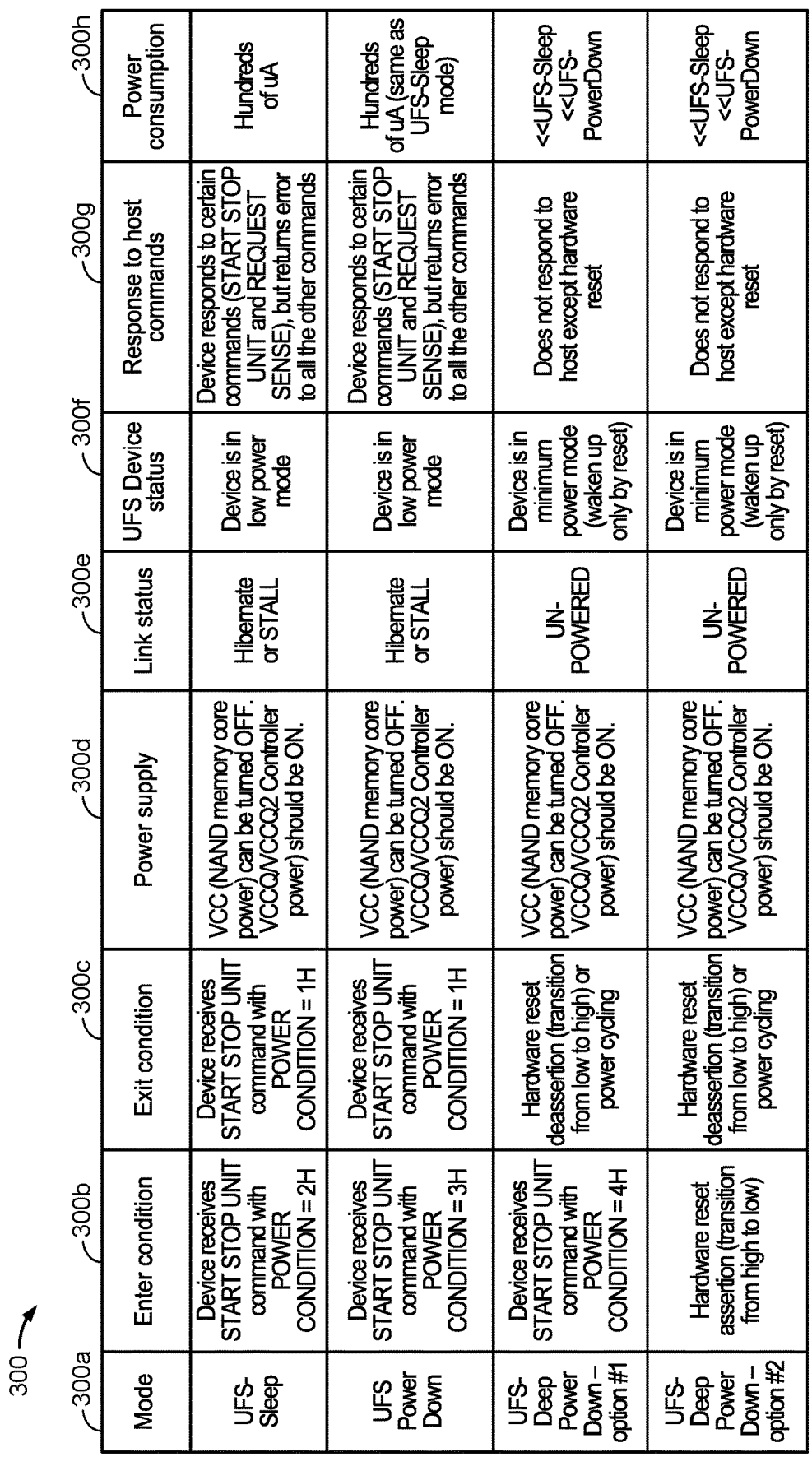
FIGS. 3A-C illustrate a table with exemplary power modes for a Flash memory device and circuit configurations thereof.

With reference now to FIG. 3A, table 300 is shown, illustrating features of some of the power modes already discussed as being available in existing JEDEC standards for UFS memory systems (e.g., as shown in table 200), juxtaposed with exemplary power modes referred to herein as UFS deep power-down mode 1 and UFS deep power-down mode 2. Accordingly, column 300*a* identifies power modes: UFS sleep and UFS power down (also shown in table 200) and the exemplary power modes UFS deep power-down mode 1 and UFS deep power-down mode 2, with columns 300*b-h* showing various features of these power modes.

It is initially noted that there is no change from table 200 for the features of UFS sleep and UFS power down, except for noting in column 300*d* the practical implementation effect on power rails power rails VCCQ2 132*b* and VCCQ 132*c* having to be turned on, despite the corresponding element in table 200 indicating this as optional, for reasons noted above.

Exemplary power modes identified as UFS deep power-down mode 1 and UFS deep power-down mode 2 will now be discussed. In these two modes, Flash memory device 130 may be woken up by a hardware reset signal or power cycling. Flash memory device 130 need not be responsive to host device 110 in these modes, which reduces the number of circuits/blocks of Flash memory device 130 which are maintained in powered on (or partially powered on) state in these modes, in turn lowering power consumption to be much smaller than the conventional UFS sleep and UFS power down, e.g., in the order of tens of uA. In these modes, VCCQ2 132*b* and VCCQ 132*c* may remain turned on, e.g., by the use of a shared voltage regulator which lowers cost. Such a voltage regulator does not need to be controlled in the UFS deep power-down mode 1 and UFS deep power-down mode 2, which further reduces the enter and exit penalties noted above with respect to conventional low power modes.

Figure 3B:
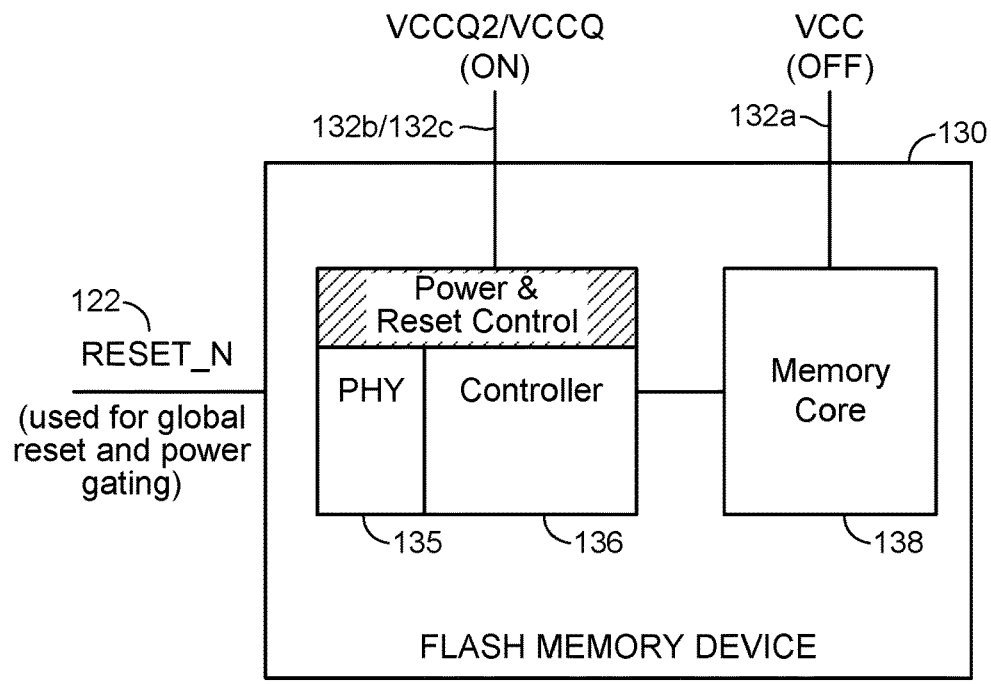
Figure 3B:
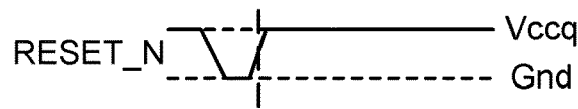
Figure 3B:
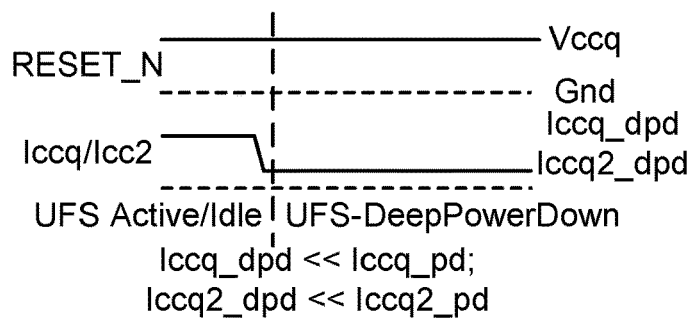

Referring now to UFS deep power-down mode 1 of table 300 in conjunction with an exemplary circuit diagram of FIG. 3B, the UFS deep power-down mode 1 may be entered (column 300*b*) when Flash memory device 130 receives a specific command from host device 110, wherein the specific command, in one exemplary implementation is shown as the START STOP UNIT command with POWER CONDITION set to a value of "4 h".

Unlike the above-discussed conventional power modes, the UFS deep power-down mode 1 may be exited by the use of options which may not require Flash memory device 130 to be responsive to commands, such as an exit command from host device 110. For example, as shown in column 300*c*, the UFS deep power-down mode 1 may be exited by the use of a hardware reset (active-low) signal being de-asserted, i.e., when it the hardware reset signal transitions from a low to high state. Alternatively, power cycling to cycle between off and on states may be used to exit the UFS deep power-down mode 1.

In the UFS deep power-down mode 1, memory core 138 may be powered down, and so, correspondingly, power control signal VCC is provided to turn off power rail VCC 132a. Some of the remaining components such as PHY 135, controller 136, etc., remain powered on with corresponding power rails VCCQ2 132b and VCCQ 132c configured to supply partial power (column 300c), but Flash memory device 130 is not expected to be responsive to any commands (e.g., associated with read/write functions of the data; CMD 114) from host device 110, which means that the link, i.e., data 112 and CMD 114 of interface 120 may be powered off, placing Flash memory device 130 in one of the least power consumption states. In some examples, the link (e.g., data 112, CMD 114, and/or RESET N 122) may be a chip-to-chip link.

The state of Flash memory device 130 (column 300f) may remain in the minimum power mode, with only the reset signal de-assertion or power cycling capable of waking up or placing Flash memory device 130 in a higher power mode. As previously noted, column 300g reiterates that while in the UFS deep power-down mode 1, Flash memory device 130 does not need to respond to host device 110, except in the instance of a hardware reset. Thus, as shown in column 300h, the power consumption of Flash memory device 130 is very low, substantially lower than the conventional UFS sleep mode/UFS power down modes discussed with reference to FIGS. 2A-C.

Figure 3C:
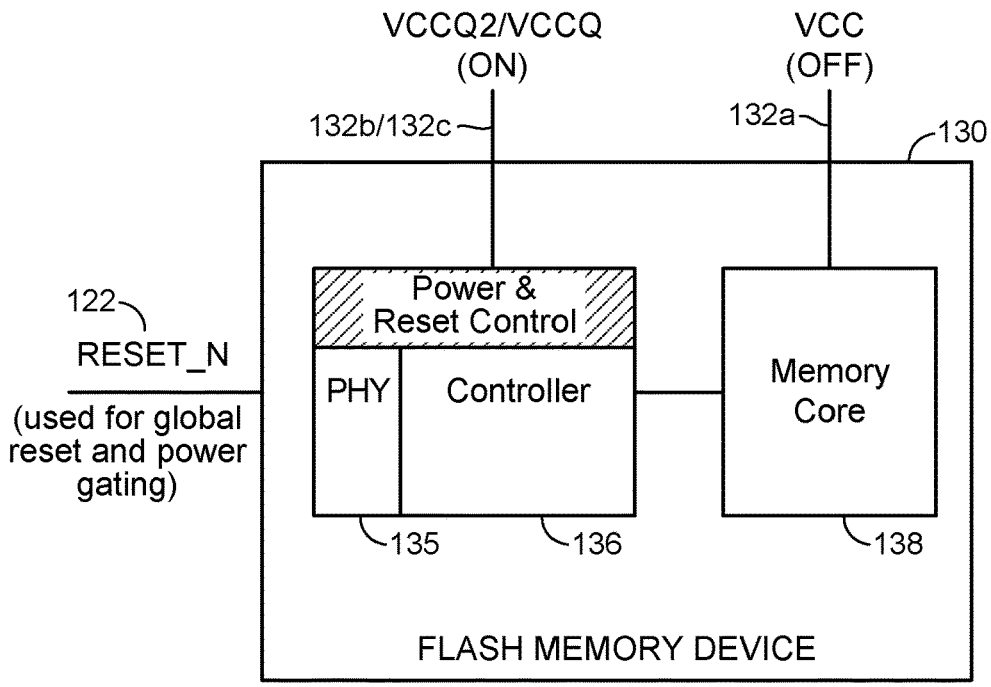
Figure 3C:
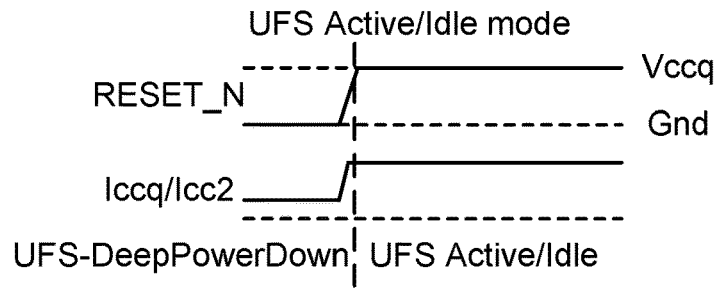
Figure 3C:
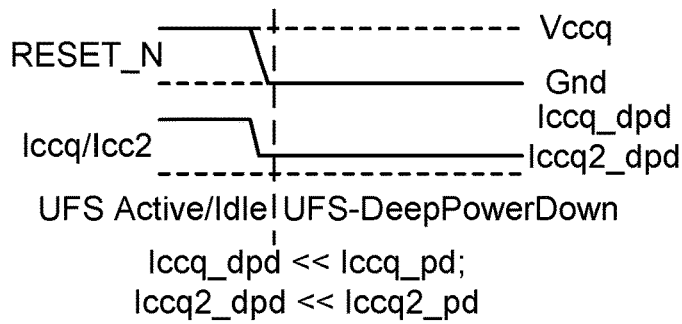

Table 300 also shows a second exemplary power mode identified as UFS deep power-down mode 2, which will now be discussed in conjunction with an exemplary circuit diagram of FIG. 3C. The UFS deep power-down mode 2 may be similar in some aspects to the above-described UFS deep power-down mode 1, with one significant difference being in how these two modes are entered into by Flash memory device 130. As shown in column 300b, Flash memory device 130 may enter the UFS deep power-down mode 2 when the above-mentioned hardware reset signal (active-low) being asserted, i.e., transitioned from high to low (rather than in response to a command from host device 110 such as the START STOP UNIT command with POWER CONDITION set to a value of "4 h" in the case of UFS deep power-down mode 1 discussed above).

Similar to the UFS deep power-down mode 1, the UFS deep power-down mode 2 may also be exited by the use of options which may not require Flash memory device 130 to be responsive to commands, such as an exit command from host device 110. For example, as shown in column 300c, the UFS deep power-down mode 2 may also be exited by the use of the hardware reset (active-low) signal being de-asserted, i.e., when the hardware reset signal transitions from a low to high state. Alternatively, power cycling (e.g., effected by host device 110) may be used to exit the UFS deep power-down mode 2 as well.

Similar to the UFS deep power-down mode 1, in the UFS deep power-down mode 2, memory core 138 may be powered down, and so, correspondingly, power control signal VCC is provided to turn off power rail VCC 132a. Some of the remaining components such as PHY 135, controller 136, etc., remain powered on in the UFS deep power-down mode 2 with corresponding power rails VCCQ2 132b and VCCQ 132c configured to supply partial power (column 300c), but Flash memory device 130 is not expected to be responsive to any commands from host device 110, which means that the link, i.e., data 112 and CMD 114 of interface 120 may be powered off, placing Flash memory device 130 in one of the least power consumption states, similar to the UFS deep power-down mode 1.

The state of Flash memory device 130 (column 300f) may remain in the minimum power mode, with only the reset signal de-assertion or power cycling capable of waking up or placing Flash memory device 130 in a higher power mode. As previously noted, column 300g reiterates that while in the UFS deep power-down mode 2, Flash memory device 130 does not need to respond to host device 110, except in the instance of a hardware reset. Thus, as shown in column 300h, the power consumption of Flash memory device 130 is also very low in the UFS deep power-down mode 2, once again substantially lower than the conventional UFS sleep mode/UFS power down modes discussed with reference to FIGS. 2A-C.

Column 300e illustrates the link status pertaining to data 112 and CMD 114 of interface 120 in the various above described mode. For the UFS sleep mode and the UFS power down mode, the link status is to stall or hibernate, similar to the link status in these modes discussed with reference to column 200e of FIG. 2A. For the exemplary power modes, UFS deep power-down mode 1 and UFS deep power-down mode 2, the link status in column 300e shows that interface 120 is powered down or unpowered, which leads to further power savings in these modes since interface 120 is not kept active because Flash memory device 130 is only woken up by a hardware reset or power cycling and is not responsive to commands/data on interface 120 from host device 110.

Figure 4:
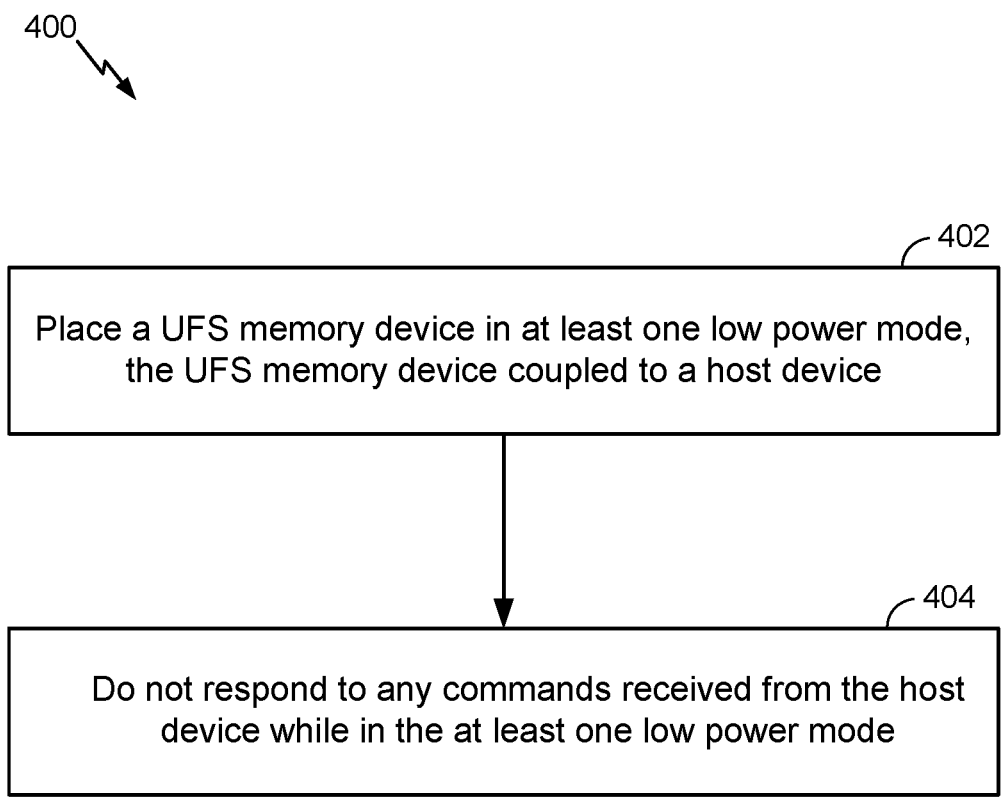
FIG. 4 illustrates a flow-chart pertaining to a method of power management for a Flash memory device, according to exemplary aspects of this disclosure.

It will be appreciated that aspects include various methods for performing the processes, functions and/or algorithms disclosed herein. For example, FIG. 4 illustrates an exemplary method 400 of power management of a Universal Flash Storage (UFS) memory device (e.g., Flash memory device 130) communicatively coupled to a host device (e.g., host device 110).

Block 402 comprises placing the UFS memory device in at least one low power mode (e.g., deep power-down mode 1 or deep power-down mode 2).

Block 404 comprises, while in at least one low power mode (e.g., deep power-down mode 1 or deep power-down mode 2), not responding to any commands which may be received from the host device, thereby enabling a power down state of components which may be needed to be retained in the powered on state if they were required to be responsive to the commands from the host device.

Accordingly, it will also be appreciated that disclosed aspects include an apparatus such as processing system 100 comprising a Universal Flash Storage (UFS) memory device (e.g., Flash memory device 130) communicatively coupled to a host device (e.g., host device 110) and means for placing the UFS memory device in at least one low power mode (e.g., a command received from host device 110 or RESET N 122) wherein the UFS memory device is not responsive to any commands received from the host device.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include a computer-readable media embodying a method of power management of a Flash memory device. Accordingly, the invention is not limited to illustrated examples and any means for performing the functionality described herein are included in aspects of the invention.

Figure 5:
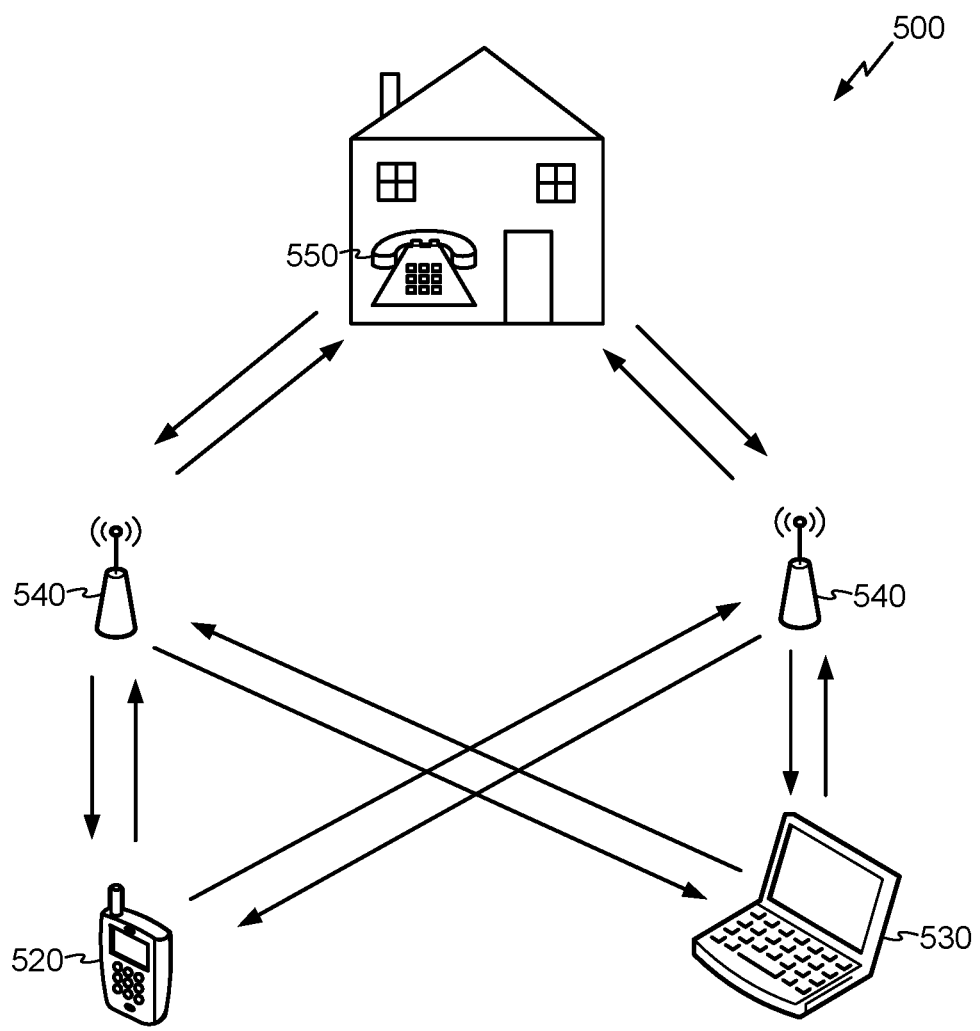
FIG. 5 illustrates a block diagram showing an exemplary wireless communication system in which aspects of the disclosure may be advantageously employed.

FIG. 5 illustrates an exemplary wireless communication system 500 in which an aspect of the disclosure may be advantageously employed. For purposes of illustration, FIG. 5 shows three remote units 520, 530, and 550 and two base stations 540. In FIG. 5, remote unit 520 is shown as a mobile telephone, remote unit 530 is shown as a portable computer, and remote unit 550 is shown as a fixed location remote unit in a wireless local loop system. For example, the remote units may be a set top box, a music player, a video player, an entertainment unit, a navigation device, a server, a personal digital assistant (PDA), a fixed location data unit, a computer, a laptop, a tablet, a communications device, a mobile phone, or other similar devices that store or retrieve data or computer instructions, or any combination thereof. Although FIG. 5 illustrates remote units according to the teachings of the disclosure, the disclosure is not limited to these exemplary illustrated units. Aspects of the disclosure may be suitably employed in any device which includes active integrated circuitry including memory and on-chip circuitry for test and characterization.

The foregoing disclosed devices and methods are typically designed and are configured into GDSII and GERBER computer files, stored on a computer-readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. An apparatus comprising:
a Universal Flash Storage (UFS) memory device, wherein the UFS memory device configured to support two or more power modes, wherein the two or more power modes comprise:
a first low power mode entered with a command from a host device, wherein the UFS memory device in the first low power mode is configured to be responsive to commands received from the host device;
a second low power mode, wherein the UFS memory device in the second low power mode is configured not to be responsive to any commands received from the host device,
wherein the memory device is configured to enter the first low power mode in response to the command with a first power condition and to enter the second low power mode in response to the command with a second power condition, and
wherein the UFS memory device is configured to exit the second low power mode based on a power cycle or a hardware reset signal.

2. The apparatus of claim 1, further comprising the host device and a link, wherein the host device provides the command and the hardware reset signal to the UFS memory device via the link.

3. The apparatus of claim 2, wherein, in the second low power mode, the link between the host device and the UFS memory device is powered down.

4. The apparatus of claim 1, wherein the second low power mode is entered after the UFS memory device place various components of the UFS memory device in different power states.

5. The apparatus of claim 1, wherein, in the second low power mode, a memory core of the UFS memory device comprising Flash memory cells is powered down.

6. The apparatus of claim 1, wherein, in the second low power mode, one or more of a controller, input/output (I/O) block, or physical interface (PHY) of the UFS memory device is partially powered on, based on a second power rail and a third power rail being turned on.

7. The apparatus of claim 1, wherein power consumed by the UFS memory device in the second low power mode is lower than power consumed by the UFS memory device in the two or more power modes other than the second low power mode.

8. The apparatus of claim 1, wherein the command is a START STOP UNIT command.

9. An apparatus comprising:
a host device configured to
provide a command to a Universal Flash Storage (UFS) memory device to place the UFS memory device in a first low power mode, wherein the UFS memory device in the first low power mode is configured to be responsive to commands received from the host device;
place the UFS memory device in a second low power mode, wherein the UFS memory device in the second low power mode is configured not to be responsive to any commands received from the host device and is configured to exit the second low power mode based on a power cycle or a hardware reset signal;
wherein the host device is configured to place the memory device in the first low power mode in response to the command with a first power condition and in the second low power mode in response to the command with a second power condition.

10. The apparatus of claim 9, wherein the host device is further configured to provide the hardware reset signal.

11. The apparatus of claim 10, further comprising the UFS memory device and a link, wherein the host device is configured to provide the command and the hardware reset signal via the link.

12. The apparatus of claim 11, wherein, in the second low power mode, the link between the host device and the UFS memory device is powered down.

13. The apparatus of claim 9, wherein the command is a START STOP UNIT command.

14. An apparatus comprising:
a Universal Flash Storage (UFS) memory device, wherein the UFS memory device configured to support two or more power modes, wherein the two or more power modes comprise:

a first low power mode entered with a command from a host device, wherein the UFS memory device in the first low power mode is configured to be responsive to commands received from the host device;

a second low power mode, wherein the UFS memory device in the second low power mode is configured not to be responsive to any commands received from the host device, wherein the memory device is configured to enter the first low power mode in response to the command with a first power condition and to enter the second low power mode in response to a hardware reset assertion, and wherein the UFS memory device is configured to exit the second low power mode based on a power cycle or a hardware reset signal.

* * * * *